United States Patent [19]

Lawrence et al.

[11] 3,905,162

[45] Sept. 16, 1975

[54] METHOD OF PREPARING HIGH YIELD SEMICONDUCTOR WAFER

[75] Inventors: John E. Lawrence, Cupertino; Jules C. Santoro, San Jose, both of Calif.

[73] Assignee: Silicon Material, Inc., Mountain View, Calif.

[22] Filed: July 23, 1974

[21] Appl. No.: 490,999

[52] U.S. Cl. .................. 51/281 SF; 51/283; 51/322

[51] Int. Cl.$^2$ ............................................ B24B 1/00

[58] Field of Search ............ 51/281 R, 281 SF, 319, 51/283, 322, 326, 327; 29/580, 583, 569

[56] References Cited

UNITED STATES PATENTS

| | | | |
|---|---|---|---|
| 2,793,420 | 5/1957 | Johnston | 29/580 X |
| 2,984,897 | 5/1961 | Godfrey | 29/580 X |
| 3,069,297 | 12/1962 | Beale | 29/580 X |
| 3,170,273 | 2/1965 | Walsh | 51/281 R |
| 3,475,867 | 11/1969 | Walsh | 51/281 R |
| 3,590,479 | 7/1971 | Devries | 29/580 |
| 3,809,050 | 5/1974 | Chough | 51/235 X |

*Primary Examiner*—Donald G. Kelly
*Attorney, Agent, or Firm*—Schatzel & Hamrick

[57] ABSTRACT

The method of preparing a semiconductor wafer introduces a controlled amount and distribution of lattice damage to the wafers prior to product fabrication processing steps. Semiconductor product performance characteristics improve when excess vacancies and contaminant impurities are drawn away from the pattern side of a wafer to affix themselves to the lattice damage on the reverse side of the wafer. The method includes applying an abrasive material to the backside of a rotating wafer to form a substantially circular pattern of lattice damage. The resultant distribution of lattice damage retards wafer warpage and breakage. The method lends itself to preparing virgin wafers and reclaiming used semicondcutor wafers.

7 Claims, 1 Drawing Figure

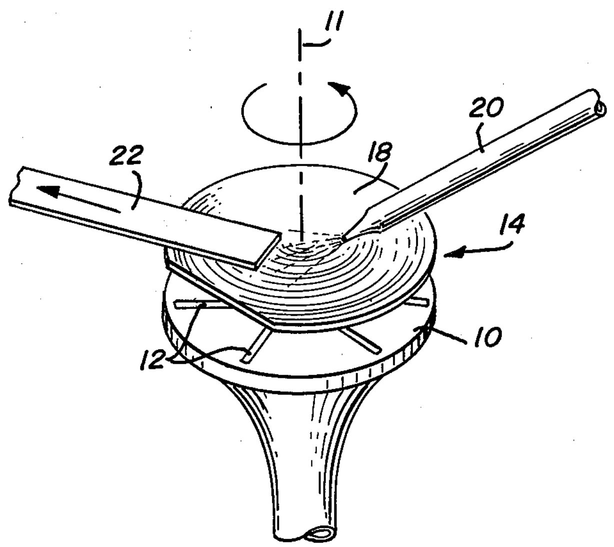
11
20
22
18
14
10
12

METHOD OF PREPARING HIGH YIELD SEMICONDUCTOR WAFER

BACKGROUND OF THE INVENTION

1. Field of the Invention

This invention relates generally to a method for introducing a controlled amount and distribution of lattice damage to the back face of semiconductor wafers prior to product fabrication processing steps and more particularly to a method of preparing a semiconductor wafer which includes grinding a substantially circular pattern of lattice damage on the back face of the wafer.

2. Description of the Prior Art

J. E. Lawrence wrote in Semiconductor Silicon — 1973 "Recent trends in material technology and process development have been toward the elimination of lattice defects and lessening a dependence on the dynamic properties of silicon such as the 'perfect strain-free' process developed by Nakamura et al. Their's was a masterful achievement. It would be unfortunate, however, if the various beneficial features of lattice imperfections were overlooked, such as their ability to control the concentration and distribution of point defects (vacancies and impurities). Control of point defects will permit the development of products having higher yields and greater performance."

Although numerous technical journal articles in the past decade by J. E. Lawrence, and others have clearly identified the semiconductor product yield advantages brought about by crystal lattice defects, still lattice damage is feared due to wafer warpage, wafer breakage, and impurity redistribution in and near a semiconductor product's electrically active regions.

At this time practically all silicon wafers sold to semiconductor product manufacturers must be essentially free of lattice defects. The requirement is part of the industry silicon material specification.

A major semiconductor product failure mode directly contributed by wafers free of lattice damage is high leakage currents brought about by the clustering of excess point defects (vacancies and contaminant impurities) near the wafer surface. Excessive concentrations of point defects occur naturally in crystals since they are introduced to the crystal at the melt temperature. When the crystal wafer is heated at a semiconductor product fabrication processing temperature, about 300°C below melt, the point defect concentration must decrease to the solubility limit defined by the processing temperature. In wafers free of lattice imperfections, the excess point defects must annihilate by diffusion to the wafer surface or by point defect cluster formation. Both point defect annihilation modes take place. However, the cluster of contaminant impurities near the front, or device, surface of a wafer will contribute to semiconductor product failure due to high leakage currents.

E. J. Metz, J. E. Lawrence and A. Tasch, et.al, each reported on their separate studies which showed semiconductor yields increased by the generation of lattice damage to the back surface of semiconductor wafers. The mechanism for this yield improvement is well understood as the Cottrell attraction between crystal lattice damage and point defects. A. H. Cottrell first theorized that point defects have localized strain field and dislocations similarly have strain fields. The combination of the point defect and the dislocation will always result in a net decrease in lattice strain. Therefore, excess point defects will always be attracted to regions of great lattice damage. Fresh lattice damage on the back face of otherwise disorder-free crystal wafers will improve semiconductor product yields by drawing the excess point defects to the back of wafers, thus leaving the front, or device, face free of point defect clusters, hence lower leakage currents for higher semiconductor product yields.

Control over the distribution and amount of lattice damage to the back face of semiconductor wafers is very important if product yields are to be maximized and wafer warpage and breakage is to be avoided.

Some of the prior art references relative to this invention include articles by J. E. Lawrence, "Correlation of Silicon Material Characteristics and Device Performance", *Semiconductor Silicon* — 1973, Edited by H. R. Huff and R. R. Burgess, the Electrochemical Society Softbound Symposium Series (1973); M. Nakamura, T, Kato, T. Yonezawa, M. Watanabe, Metallographic S. Takei *Electrochemical Society Meeting*, Abstract 74, Washington (1971); J. E. Lawrence, "On Lattice Disorders, Solute Diffusion Precipitation, and Gettering Silicon Devices", *Semiconductor Silicon*, Edited by R. R. Haberecht and E. L. Kern, The Electrochemical Society Softbound Symposium Series (1969), pp. 596–609; J. E. Lawrence, "Behavoir of Dislocations in Silicon Semiconductor Devices: Diffusion, Electrical". *Journal of the Electrochemical Society*, Vol. 115, No. 8, August 1968, pp. 860–865; J. E. Lawrence, "metallographic Analysis of Gettered Silicon", *Transactions of the Metallurigical Society of AIME*, *Vol.* 242, March 1968, pp. 484-489; A. F. Tasch, Jr., D. D. Buss, H. R. Huff, T. E. Hartman, and V. R. Porter, "Plastic Deformation and MOS Integrated Circuit Performance," *Semiconductor Silicon* — 1973, Edited by H. R. Huff and R. R. Burgess, The Electrochemical Society Softbound Symposium Series (1973), pp. 658–669; and E. J. Metz, *The Electrochemical Society*, Vol. 112 (1965), pp. 420.

SUMMARY OF THE PRESENT INVENTION

Accordingly, it is an object of the present invention to provide a method for forming a specific distribution of lattice damage, i.e., substantially circular, and a controlled amount of lattice damage to the back face of wafers used in the fabrication of semiconductor products.

This invention is directed toward a method of introducing a controlled distribution and amount of lattice damage to the back face of semiconductor wafers prior to the processing steps that will lead to the fabrication of unique semiconductor products. The steps of the method include applying an abrasive material to the back face of a spinning wafer. The relative motion between the abrasive material and the wafer generates a substantially circular pattern of surface damage. A wafer rotation rate of about 1000 RPM and an abrasive movement rate of about 1 cm in 5 seconds contributes to a near uniform distribution of lattice damage in the substantially circular pattern. This distribution of lattice damage is important for the prevention of wafer warpage and breakage during semiconductor product fabrication.

The amount of pressure applied to the abrasive material when it is in contact to the spinning wafer controls the amount of uniform lattice damage in the wafer back surface. The size of the abrasive grit similarly influences the amount of lattice damage. A 600 grit size has been used with best results. When much smaller grit sizes are used, inadequate damage is found to occur, whereas much larger grit sizes cause excessive or destructive damage. The grit material should be SiC, $CeO_2$, $ZrO_2$, diamond, or $Al_2O_3$. The back wafer surface should be lubricated with clean, preferably deionized, water during the grinding process. The absence of, or inadequate supply of water will cause the process to flow, not cut, the back surface lattice. The removal of about 5 micrometers of semiconductor material by this procedure is desirable. This method lends itself to reclaimed semiconductor wafers, as well as virgin wafers that have not seen prior semiconductor product processing steps.

An advantage of the present invention is that it serves to increase product yields.

Other objects and advantages will be apparent to those skilled in the art after having read the following detailed disclosure which makes reference to the figure of the drawing.

IN THE DRAWING

The single figure is a perspective view of a spinning semiconductor wafer as a controlled circular pattern of lattice damage is introduced to its back face in accordance with the present invention.

DETAILED DESCRIPTION OF THE PREFERRED EMBODIMENT

Referring now to the drawing, a wafer holder means 10, preferably a vacuum chuck that is rotatable about an axis 11, is illustrated. The top surface of the chuck includes openings 12 which extend toward a vacuum source (not shown). A semiconductor, or silicon, wafer 14, which is to be prepared in accordance with the process of this invention, is placed on the top surface of the vacuum chuck with its front face against the chuck and its back face 18 exposed. The wafer 14 generally has a diameter of about either 2 or 3 inches and the outer diameter of the chuck is preferably about ⅛ inch larger than the diameter of the wafer. After the wafer is positioned on the chuck, a vacuum is drawn through the openings 12 to secure the wafer to the chuck and the chuck is energized to rotate at a speed of between 1,000 and 1,500 revolutions per minute.

The next operation is to continually wet the back face 18 of the spinning wafer with a clean lubricating and cooling agent, preferably deionized water 20. Alternatively, a water detergent mixture may be used. The deionized water should be maintained near room temperature and have a purity of about 10 megaohm quality.

Once the back face is wet, an abrasive material 22 is lightly applied against the back face of the wafer. The abrasive material is initially brought into contact with the center of the back face and is moved radially outwardly at a rate of about 1 centimeter in 5 seconds. The wafer is continually wetted. Preferably, the abrasive material is a cloth sheet of 600 grit SiC, or $Si_2$ $Al_3$ abrasive, although other abrasives such as $CeO_2$, diamond or $ZrO_2$ may also be used. An abrasive disk may be used in place of abrasive cloth. The action of the abrasive against the rapidly rotating wafer back face causes the substantially circular removal of the wafer material, until concentric ring-shaped striations are visible. It has been found that the rings become visible when about 5 micrometers have been removed. The abrasive material should be withdrawn when about 5 micrometers of the wafer have been removed. Experience has indicated that when very small grit sizes are used, inadequate damage occurs, whereas very large grit sizes cause excessive or destructive damage.

After the abrasive is withdrawn the wetting is continued for another 5 seconds. It has been found that the absence of or inadequate supply of water will cause the abrading operation to flow, not cut, the back surface lattice. As soon as the back face is dry, the rotation of the chuck is discontinued and the vacuum is released. The wafer is then removed and its front face is polished to form a strain-free mirror-like surface. The polishing step is preferably performed with a conventional chemical-mechanical polishing process.

With this described wafer preparation process, a particular controlled pattern of shallow surface lattice damage is generated on the back face of single crystal semiconductor wafers. The pattern resembles a plurality of substantially concentric circles. It should be recognized, however, that since the abrasive material is moved radially outwardly at a slow rate, a slightly spiral effect may be superimposed on the circular pattern.

The particular circular lattice strain pattern minimizes wafer warpage and breakage during subsequent high temperature treatments utilized in semiconductor product fabrication. For example, it has been discovered that if the back face is ground uniaxially with a single pass or with many offset passes in alternating directions, the wafer tends to deform and warp during subsequent heating steps of the fabrication of a semiconductor product.

The circular pattern of lattice damage on the back wafer surface will draw excess point defects away from the front wafer face, since excess point defects are attracted to the regions of great lattice damage, thus leaving the front face free of point defect clusters.

This process lends itself for use in preparing virgin semiconductor wafers or in reclaiming used wafers. For example, a process for reclaiming used semiconductor wafers includes the steps of stripping external conducting and insulating layers from the wafer, gettering the wafer in a heated phosphorus environment so as to draw contaminant impurities toward the surfaces of the wafer, and etching the surfaces of the wafer so as to effectively remove contaminant and dopant impurities of type and concentration not present in the as-grown wafer. Certain details of the process have been ommited from this description since they are the same as disclosed in copending U.S. Pat. application, Ser. No. 496,072, filed Aug. 9, 1974 entitled "Method of Reclaiming A Semiconductor Wafer", and invented by John E. Lawrence and that application is incorporated by reference to this specification for any details not disclosed herein. After those steps are performed, in accordance with this invention, the reclaiming process includes the steps of grinding a circular pattern of lattice damage on the back face, and then polishing the front face to form a substantially strain-free mirror-like surface. Similarly, the latter two steps of grinding and polishing are applied to virgin wafers after all stress relief etching operations are completed in order to retain the circular pattern of lattice damage on the back face. The back face is preferably ground prior to the polishing step in order to avoid scratching or contaminating the front wafer surface.

From the above, it will be seen that there has been provided a method for preparing a semiconductor wafer prior to device fabrication which fulfills all of the objects and advantages set forth above.

While there has been described what is at the present considered to be the preferred embodiment of the present invention, it will be understood that various modifications may be made therein, and it is intended to cover in the appended claims all such modifications as fall within the true spirit and scope of the invention.

What is claimed is:

1. A method of preparing a semiconductor wafer prior to device fabrication comprising the steps of:
   rotating a wafer in the plane of one of its faces;
   wetting said one face with a liquid lubricant;
   grinding a substantially circular pattern of lattice damage on said one face; and
   polishing the other face of said wafer to form a substantially strain-free mirror-like surface.

2. A method of preparing a semiconductor wafer prior to device fabrication as recited in claim 1 wherein the step of grinding includes depressing an abrasive material against said one face.

3. A method of preparing a semiconductor wafer prior to device fabrication as recited in claim 2 wherein said one face is wetted with deionized water prior to, during, and after the abrasive material is depressed against said one face.

4. A method of preparing a semiconductor wafer prior to device fabrication as recited in claim 2 wherein said abrasive material has a grit size of about 600.

5. A method of preparing a semiconductor wafer prior to device fabrication as recited in claim 2 wherein at least 5 micrometers of said wafer are removed from said one face during said grinding step.

6. A method of preparing a semiconductor wafer prior to device fabrication as recited in claim 2 wherein said wafer is rotated at a speed of between 1,000 and 1,500 revolutions per minute.

7. A methid of preparing a semiconductor wafer prior to device fabrication as recited in claim 3 wherein following termination of the grinding step said wafer is rotated until said one face is dry.

* * * * *